(12) United States Patent
Lutz et al.

(10) Patent No.: US 9,059,726 B2
(45) Date of Patent: Jun. 16, 2015

(54) APPARATUS AND METHOD FOR PERFORMING A CONVERT-TO-INTEGER OPERATION

(75) Inventors: David Raymond Lutz, Austin, TX (US); Neil Burgess, Austin, TX (US)

(73) Assignee: ARM Limited, Cambridge (GB)

( * ) Notice: Subject to any disclaimer, the term of this patent is extended or adjusted under 35 U.S.C. 154(b) by 423 days.

(21) Appl. No.: 13/469,109

(22) Filed: May 11, 2012

(65) Prior Publication Data

US 2013/0304785 A1 Nov. 14, 2013

(51) Int. Cl.
*H03M 7/24* (2006.01)
*G06F 9/30* (2006.01)
*H03M 7/28* (2006.01)

(52) U.S. Cl.
CPC ........ *H03M 7/28* (2013.01); *H03M 7/24* (2013.01); *G06F 9/30025* (2013.01)

(58) Field of Classification Search
CPC .............................. G06F 9/30025; H03M 7/24
USPC ......................................................... 708/204
See application file for complete search history.

(56) References Cited

U.S. PATENT DOCUMENTS

| 5,257,215 | A  | * | 10/1993 | Poon ............................ 708/204 |
| 6,965,906 | B1 | * | 11/2005 | Dhablania .................... 708/204 |
| 2007/0220076 | A1 | * | 9/2007 | Hinds ........................... 708/204 |
| 2011/0029760 | A1 | * | 2/2011 | Elmer et al. .................. 712/209 |
| 2012/0124116 | A1 | * | 5/2012 | Yu et al. ....................... 708/204 |

* cited by examiner

*Primary Examiner* — Chuong D Ngo
(74) *Attorney, Agent, or Firm* — Nixon & Vanderhye P.C.

(57) ABSTRACT

A data processing apparatus includes processing circuitry for performing a convert-to-integer operation for converting a floating-point value to a rounded two's complement integer value. The convert-to-integer operation uses round-to-nearest, ties away from zero, rounding (RNA rounding). The operation is performed by generating an intermediate value based on the floating-point value, adding a rounding value to the intermediate value to generate a sum value, and outputting the integer-valued bits of the sum value as the rounded two's complement integer value. If the floating-point value is negative, then the intermediate value is generated by inverting the bits without adding a bit value of 1 to a least significant bit of the inverted value.

19 Claims, 3 Drawing Sheets

APPARATUS AND METHOD FOR PERFORMING A CONVERT-TO-INTEGER OPERATION

BACKGROUND TO THE INVENTION

1. Field of the Invention

The present invention relates to the field of data processing. In particular, the invention relates to an apparatus and method for performing a convert-to-integer operation for converting a floating-point value to a rounded two's complement integer value.

2. Description of the Prior Art

A data processing apparatus may represent numbers in different ways. A number represented as an integral data value can only represent integer data values, since all the bits of the integral data value represent integer values and the radix point is positioned to the right of all the bits of the integral value. A fixed-point data value is assumed to have a radix point at a fixed location so that bits to the left of the radix point represent integer values and bits to the right of the radix point represent fractional values. In both an integral data value and a fixed-point data value, the position of the radix point (also known as a binary point) is fixed and it is not necessary to encode the position of the radix point in the data value itself.

On the other hand, in a floating-point representation, the radix point may float left and right within the data value. A floating-point value is represented using a significand and an exponent, with the significand representing the significant digits of the floating-point number and the exponent representing the position of the radix point relative to the significand. For a given number of bits, the floating-point representation is able to represent a wider range of numbers than the integral or fixed-point representation. However, the extra range is achieved at the expense of reduced precision since some of the bits are used to store the exponent, and so fewer bits are available for the significand.

Negative numbers are represented in a different way in a floating-point representation compared to an integral or fixed-point representation. In a floating-point representation, negative numbers are represented in a sign-magnitude form. A floating-point value has a sign bit which represents whether the floating-point number is positive or negative. The remaining bits representing the significand and the exponent then represent the magnitude of the value. That is, a floating-point value with sign bit S, exponent exp and significand f corresponds to a numeric value of $N=(-1)^S \times 2^{exp} \times (1+\Sigma(f[i] \times 2^{-i}))$, where i=1 ... n, n is the number of bits used to represent the significand, and $f[i]=\{0,1\}$ is the $i^{th}$ most significant fractional bit of N. The exponent exp is the unbiased or true exponent of the floating-point value (in some representations the exponent may be biased so that the true exponent exp is obtained by subtracting a bias from the exponent value E of the floating-point value).

Hence, for a floating-point value, all the bits of the significand represent positive values with the magnitude indicated by the significand being multiplied by $2^{exp}$. Whether the number is positive or negative is indicated by the sign bit. Therefore, positive and negative numbers having the same magnitude have the same significand and exponent irrespective of whether the sign bit indicates a positive or negative number.

On the other hand, integral data values and fixed-point data values use two's complement representation to represent negative numbers. In two's complement representation, the most significant bit of the value represents a negative value, with all the other bits representing positive values, so that a two's complement number is considered to be a positive number if the most significant bit is 0 and to be negative if the most significant bit is 1. For an 8-bit two's complement value, the most negative number that can be represented is therefore 0b10000000 (−128), and the most positive number that can be represented is 0b01111111 (+127). To convert a positive number into a negative number of the same magnitude (i.e. to determine the two's complement of the positive number), all the bits of the positive number are inverted and a bit value of 1 is added to the least significant bit of the inverted value. For example, to convert 0b01011001 (+89) to its two's complement (−89), the bits are inverted to give 0b10100110 (−90) and one is added to the inverted value to give 0b10100111 (−89).

Hence, there are different ways in which numbers can be represented, and so it may be desirable to convert between different representations. For example, a floating-point value may be converted to an integral value or to a fixed-point value in two's complement form. Also, it may be desirable to round the fractional part of the floating-point number to an integer value in either the integral or fixed-point form. Different rounding techniques may be used to determine which of two adjacent integers a given fractional value should be rounded to. One such rounding mode is the round to nearest, ties away from zero, rounding mode (RNA rounding) in which a fractional value lying between two adjacent integers is rounded to the nearest of the adjacent integers, with a value lying half way between two integers being rounded away from zero. For example, a value of 2.2 would be rounded to the nearest integer value of 2, a value of 2.5 halfway between 2 and 3 would be rounded to an integer value of 3 (away from zero) and a value of −3.5 halfway between −3 and −4 would be rounded to an integer value of −4 (again, away from zero).

Hence, the present technique seeks to provide an efficient way of performing a convert-to-integer operation for converting a floating-point value to a rounded two's complement integer value, where RNA rounding is performed.

SUMMARY OF THE INVENTION

Viewed from one aspect, the present invention provides a data processing apparatus comprising:

processing circuitry configured to perform a convert-to-integer operation for converting a floating-point value to a rounded two's complement integer value, said floating-point value having a significand and an exponent;

wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero;

said processing circuitry comprises intermediate value generating circuitry configured to generate an intermediate value based on said floating-point value, and adding circuitry configured to add a rounding value to the intermediate value to generate a sum value;

said processing circuitry is configured to output the integer-valued bits of the sum value as the rounded two's complement integer value; and if said floating-point value has a negative value, then said intermediate value generating circuitry is configured to generate said intermediate value by inverting the bits of the significand of said floating-point value without adding a bit value of 1 to a least significant bit of the inverted value.

The present technique provides processing circuitry configured to perform a convert-to-integer operation for converting a floating-point value to a rounded two's complement integer value. Since the floating-point value may have a fractional value and is to be converted to an integer value, a rounding operation is performed as part of the convert-to-integer operation. The rounding is performed according to the round-to-nearest, ties away from zero, rounding mode (RNA rounding). An efficient way of performing rounding is to add a rounding value to the floating-point value to be rounded to generate a sum value, and then to select the integer-valued bits of the sum value as the rounded value (truncating the fractional-valued bits).

Since the floating-point value is to be converted to a two's complement value, one would expect that, if the floating-point value is negative, then the significand of the floating-point value should be inverted and a bit value of 1 should be added to a least significant bit of the inverted value, because this would be the conventional way of converting a positive magnitude value into a negative two's complement value (although the floating-point value is negative, the significand of the floating-point value has a positive magnitude since it is the sign bit which indicates that the floating-point value is negative, not the significand).

However, the inventors of the present technique recognised that converting to a two's complement value in this way can be problematic when performing RNA rounding by adding a rounding value and truncating the sum value to generate the rounded value. While this technique would work for positive values, for negative values the wrong rounded result can be generated. As shall be described in the detailed description below, this is because rounding by adding a rounding value and truncating the sum value to output integer-valued bits would usually assume that the truncation results in the data value being rounded towards zero, since at least some of the fractional valued bits are likely to have a bit value of 1, and so removal of these bits would reduce the magnitude of the number towards zero. However, with a negative two's complement value truncation of one or more least significant bits actually causes the value to tend towards negative infinity, since any bit values of 1 in the truncated bits counteract the negative most significant bit of the two's complement value, and so removal of these bits causes the value to become more negative. This could cause a problem where sometimes a value is rounded to the wrong one of two adjacent integer values.

To address this problem, if the floating-point value is negative, then rather than converting the significand of the negative floating-point value to its two's complement, the present technique instead inverts the bits of the significand without adding a bit value of 1 to the least significant bit of the inverted value. Surprisingly, while the intermediate value generated in this way does not have the same magnitude as the original floating-point value, and so is not the true two's complement of the significand of the floating-point value, when rounded by adding the rounding value and outputting the integer-valued bits of the sum value, this leads to the correctly rounded two's complement value. This is counter-intuitive, because one would generally expect that to produce the correct two's complement value it would be necessary to add a bit value of 1 to a least significant bit following inversion of the bits. Therefore, it is surprising that a rounded two's complement value can be generated from the floating-point value without actually determining the two's complement of the floating-point value. This technique will be described in more detail below.

As well as enabling the correct rounding result to be generated, by avoiding the addition of the bit value of 1 to the inverted value, the convert-to-integer operation can be performed using just a single carry-and-propagate addition, so that the operation can be performed in fewer cycles.

Put another way, when the floating-point value is negative, then the intermediate value is generated as the one's complement of the significand of the floating-point value. The one's complement is the value obtained by inverting the bits of the significand, without adding any bit value 1 as would usually be the case when converting to a two's complement value. Surprisingly, converting the significand of the negative floating-point value to a one's complement value, not a two's complement value, and rounding by adding the rounding value and selecting integer-valued bits, gives the correctly rounded two's complement integer value.

If the floating-point has a positive value or a zero value, then it is not necessary to invert the significand to generate the intermediate value since in two's complement form a positive value or zero value has the same bit values as the corresponding signed-magnitude value. In this case, the intermediate value is generated with bit values equal to the bit values of the significand of the floating-point value. This intermediate value is then rounded in the same way as the intermediate value for a negative floating-point value, by adding a rounding value to generate a sum value, and then outputting the integer-valued bits of the sum value as the rounded two's complement integer value. Hence, another advantage of the present technique is that, aside from inverting the bits of the significand for a negative floating-point value, and not inverting the bits for a positive or zero floating-point value, the remainder of the convert-to-integer operation is the same for positive and negative values. Therefore, the control of the convert-to-integer operation is relatively efficient.

Also, the rounding value in the present technique has the same value irrespective whether the floating-point value has a positive value, a negative value or a zero value. This is possible because of the way in which the negative floating-point value is converted to a one's complement intermediate value, without adding a bit value of one.

In particular, the rounding value may have a value equivalent to a 0.5 in decimal representation. Generally, adding a half to a fractional value and then truncating fractional bits is equivalent to rounding the value to the nearest adjacent integer.

The processing circuitry may be controlled to perform the convert-to-integer operation in response to execution of a convert-to-integer instruction. Since the processing circuitry can perform the operation in hardware in response to execution of a single instruction, the convert-to-integer operation can be performed more quickly and efficiently than a system which uses software (requiring execution of multiple instructions) to perform the operation.

The processing circuitry may have shifting circuitry which shifts the floating-point value or the intermediate value to place a least significant integer-valued bit of the floating-point value or the intermediate value at a predetermined bit position. Since the rounded two's complement integer value will assume that the radix point is at a given position within the data value, the shifting circuitry is used to shift the bits of the value to the appropriate position relative to the radix point. This shifting operation may occur either before or after the generation of the intermediate value (i.e. before or after the bit inversion for a negative floating-point value).

The shift amount of the shifting circuitry may be dependent on the exponent of the floating-point value. Since the exponent indicates the position of the radix point in the floating-point value, the difference between the position of the radix point in the floating-point value and the desired position of the radix point in the rounded two's complement integer value can be determined and the floating-point value or the intermediate value can be shifted by a shift amount corresponding to the difference between these bit positions.

The rounded two's complement integer value may be an integral data value (i.e. a data value represented using the integral data type) or a fixed-point data value. In the case of the integral data value, the shifter shifts the floating-point value or the integer value so that the least significant integer-valued bit is placed at the least significant bit position. On the other hand, for a fixed-point data value, a bit position more significant than the least significant bit position is used to indicate the least significant integer-valued bit, leaving room for a fractional portion of the fixed-point data value in one or more remaining less significant bits (although since the fixed-point value is a rounded integer value, the fractional-valued bits will all be 0 or 1 depending on whether the value is positive or negative).

Viewed from another aspect, the present invention provides a data processing apparatus comprising:

processing means for performing a convert-to-integer operation for converting a floating-point value to a rounded two's complement integer value, said floating-point value having a significand and an exponent;

wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero;

said processing means comprises intermediate value generating means for generating an intermediate value based on said floating-point value, and adding means for adding a rounding value to the intermediate value to generate a sum value;

said processing means is configured to output the integer-valued bits of the sum value as the rounded two's complement integer value; and if said floating-point value has a negative value, then said intermediate value generating means is configured to generate said intermediate value by inverting the bits of the significand of the floating-point value without adding a bit value of 1 to a least significant bit of the inverted value.

Viewed from a further aspect, the present invention provides a method of performing a convert-to-integer operation for converting a floating-point value to a rounded two's complement integer value, said floating-point value having a significand and an exponent, wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero; the method comprising steps of:

generating an intermediate value based on said floating-point value;

adding a rounding value to the intermediate value to generate a sum value; and outputting the integer-valued bits of the sum value as the rounded two's complement integer value;

wherein if said floating-point value has a negative value, then said intermediate value is generated by inverting the bits of the significand of the floating-point value without adding a bit value of 1 to a least significant bit of the inverted value.

Further particular and preferred aspects of the present invention are set out in the accompanying independent and dependent claims. Features of the dependent claims may be combined with features of the independent claims as appropriate, and in combinations other than those explicitly set out in the claims.

DESCRIPTION OF EMBODIMENTS

Figure 1:
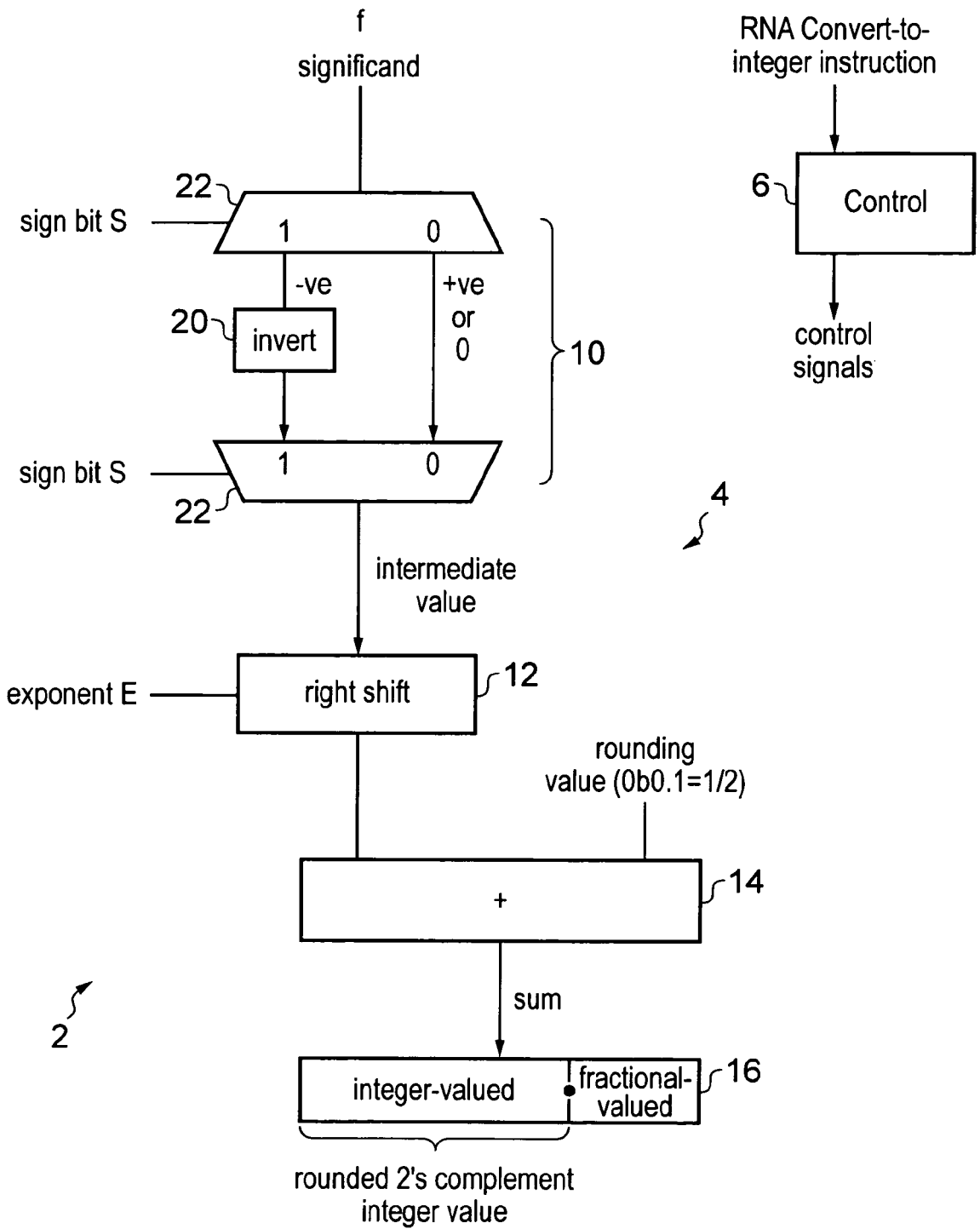
FIG. 1 illustrates an example of processing circuitry for performing a convert-to-integer operation.

FIG. 1 shows a portion of a data processing apparatus 2 for processing data. The processing apparatus 2 has processing circuitry 4 and control circuitry 6. The processing circuitry 4 comprises intermediate value generating circuitry 10, shifting circuitry 12, adding circuitry 14 and an output register 16.

The control circuitry 6 is responsive to a convert-to-integer instruction specifying RNA rounding (round to nearest, ties away from zero rounding) to control the processing circuitry 4 to perform a convert-to-integer operation. In the convert-to-integer operation, a floating-point value is converted to a rounded two's complement integer value. The rounding is carried out such that a fractional floating-point lying between two adjacent integer values is rounded to the nearest adjacent integer value, with a fractional floating-point value lying half way between two adjacent integer values being rounded to the one of the two adjacent integer values lying furthest away from zero. The RNA convert-to-integer instruction may be one of a set of different convert-to-integer instructions specifying different rounding modes. For example, other rounding modes include round to nearest, ties towards zero (RZ) rounding in which ties are resolved by rounding towards zero. Another rounding mode is round to the nearest, ties to even (RNE) rounding in which values lying half way between two adjacent integer values are rounded to the nearest even integer value. Different instruction encodings may be provided for performing convert-to-integer operations with different rounding modes. Alternatively, a single convert-to-integer instruction may be provided with a field in the instruction encoding specifying which rounding mode is to be used. The other rounding modes may be performed using any existing technique and will not be described further herein.

When a convert-to-integer instruction specifying RNA rounding is executed, the significand of the floating-point value to be rounded is provided to the processing circuitry 4. The intermediate value generating circuitry 10 generates an intermediate value based on the significand. If the sign bit S of the floating-point value is 0, indicating a positive value, then the intermediate value is generated having exactly the same bit values as the significand of the floating-point value. On the other hand, if the sign bit S has a value of 1 indicating a negative floating-point value, then an inverter 20 inverts the bits of the significand to generate the intermediate value (in this case, the intermediate value is the one's complement of the significand). The intermediate value generating circuitry 10 includes multiplexers 22 for selecting, based on the sign bit S, whether to use the non-inverted intermediate value (for positive values) or the inverted intermediate value generated by the inverter 20 (for negative values).

As shown in FIG. 1, the intermediate value is provided to a right shifter 12 which right shifts the intermediate value by a number of bit positions dependent on the exponent E of the floating-point value, to place a least significant integer-valued bit of the intermediate value at a predetermined bit position within the value. If the two's complement integer value to be generated is of the integral data type then the shifter 12 shifts the least significant integer-valued bit to the least significant bit position of the intermediate value, while if a fixed-point representation is to be used then the least significant integer-valued bit may be positioned at any desired bit position within the value.

The shifted value is then provided to an adder 14. The adder 14 adds a rounding value to the shifted value received from the shifter 12. In binary representation, the rounding value has a value of 0b0.1 (i.e. 0.5 in decimal representation), with the radix point of the rounding value being aligned with the assumed position of the radix point in the shifted value provided by the shifter 12. The sum value generated by the adding circuitry 14 is then placed in the output register 16. The processing circuitry 4 outputs the integer-valued bits of the sum value stored in the register 16 as the rounded two's complement integer value.

It will be appreciated that the shifter 12 could also be provided upstream of the intermediate value generating circuitry 10 so that the significand is first shifted, and then converted to the intermediate value by the intermediate value generating circuitry 10.

An example of converting a floating-point number −1.5 to a rounded two's complement integer value in fixed-point representation is shown below (since RNA rounding is used, −1.5 should be rounded away from zero to −2.0).
In single-precision, −1.5 is represented as 0xbfc0_0000, and it has significand:
  1100_0000_0000_0000_0000_0000
Inverting this number, without adding a bit value of 1 to the least significant.bit, gives an intermediate value of:
  0011_1111_1111_1111_1111_1111
This is the one's complement of the significand.
Right shifting the intermediate value to place the least significant integer-valued bit at the desired position gives:
  1111_1111_1111_1110.0111_1111
Adding the rounding value of 0.1 to this number gives a sum value of:
  1111_1111_1111_1110.1111_1111
for which the integer part equals −2.
Note that if we had added one after inverting the significand, to convert the significand to a two's complement number, then we would have ended up with the incorrect value −1, as shown below:
Significand:
  1100_0000_0000_0000_0000_0000
Inverted significand:
  0011_1111_1111_1111_1111_1111
Adding 1 to the least significant bit to give the two's complement of the significand:
  0100_0000_0000_0000_0000_0000
Shifting to the desired position:
  1111_1111_1111_1110.1000_0000
Adding rounding value of 0.1
  1111_1111_1111_1111.0000_0000
for which the integer part is −1.

Hence, instead of generating the two's complement of the significand, as would be expected when converting to a two's complement value, the intermediate value generating circuitry 10 generates the intermediate value as the one's complement of the significand, to enable the correct RNA rounding result to be generated by adding a rounding value and ignoring the fractional valued bits of the sum. This enables RNA rounding to be performed in the simple and efficient way with only a single add-and-carry operation (the addition of the rounding value).

Figure 2:
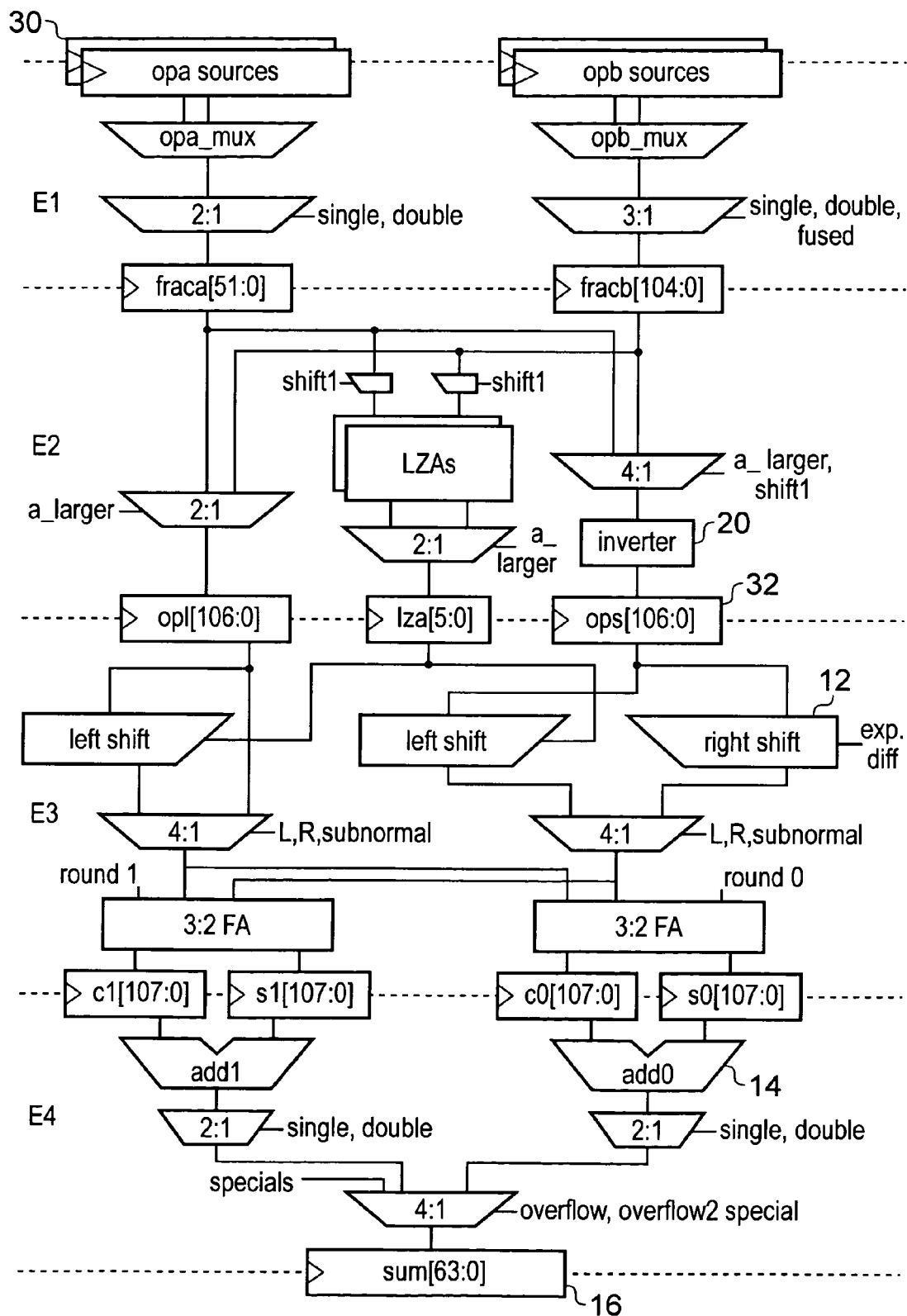
FIG. 2 schematically illustrates an example of a floating-point pipeline for carrying out floating-point arithmetic operations, including the convert-to-integer operation of the present technique.

FIG. 2 shows an example of a floating-point pipeline which may be part of a processor for performing processing operations. The pipeline is capable of performing many different types of floating-point operations, including the convert-to-integer operations discussed above. The pipeline shown in FIG. 2 reuses portions of the same circuitry for different types of floating-point operation. When performing the convert-to-integer operation, the floating-point number to be converted is placed in the opa register 30 in processing cycle E1. During processing cycle E2, the inverter 20 of the intermediate value generating circuitry inverts the significand of the floating-point value if the floating-point value is negative, and otherwise does not invert the significand. The intermediate value is then placed in register ops 32. Meanwhile, a required shift amount (exp diff) for converting the value into the required integral or fixed-point representation is determined based on the exponent of the floating-point value, and at cycle E3, a right shifter 12 shifts the value so that all of the integer bits are to the left of the position at which the radix point is assumed to reside. Also, during cycle E3 a rounding constant (round 0) equivalent to a value of a half is computed (in binary representation, with a value of 0.1, where the half bit 1 is aligned with the most significant fractional bit of the shifted value generated by the shifter 12). Then, in cycle E4 the adder 14 adds the rounding value to the shifted intermediate value to generate the sum value. The sum value is placed in register 16, from which the integer-valued bits may be read to represent the rounded two's complement integer value.

Figure 3:
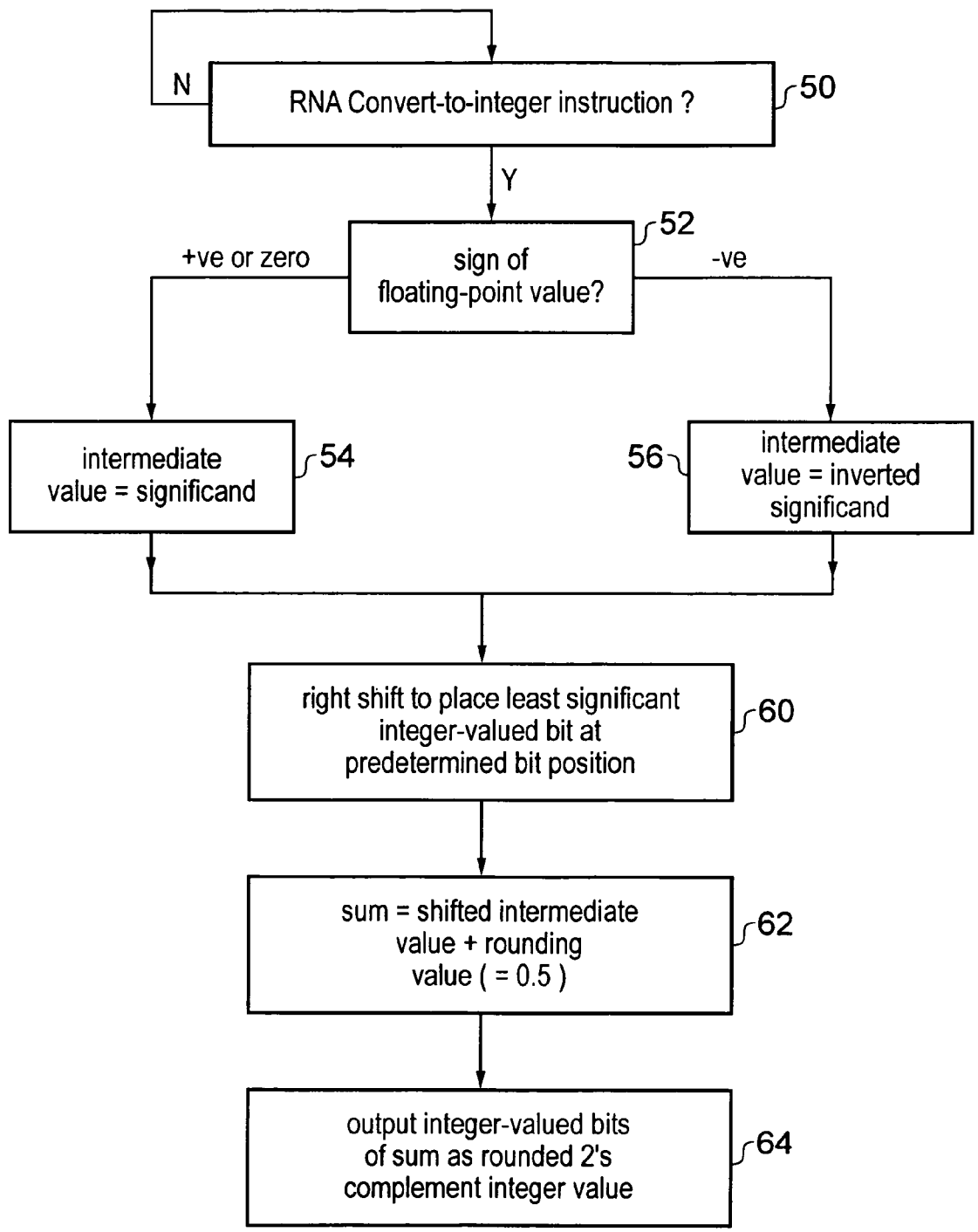
FIG. 3 illustrates a method performing a convert-to-integer operation.

FIG. 3 shows a method of performing a convert-to-integer operation. At step 50, the control circuitry 6 detects whether the processor is executing an instruction specifying that the convert-to-integer operation is to be performed using RNA rounding. If such an instruction is not being executed, then the control circuitry 6 controls the processing circuitry 4 to carry out the operations required by the instructions that are being executed. When an RNA convert-to-integer instruction is executed, then at step 52 the processing circuitry 4 checks the sign bit S of the floating-point value to be rounded. If the sign bit is 0, indicating a positive or zero-valued floating-point value, then at step 54 the intermediate value is generated as a value equal to the significand of the floating-point value. On the other hand, if the sign bit is 1 then the value is negative and so at step 56 the inverter 20 inverts the bits of significand to generate the intermediate value. In this case, the intermediate value is the one's complement of the significand because no addition of a carry bit at the least significant bit is performed.

At step 60, the intermediate value is shifted to place a least significant integer-valued bit at a predetermined bit position. The predetermined bit position is selected depending on the desired position of the radix point in the rounded two's complement value. At step 62, the rounding value of a half is added to the shifted intermediate value to generate a sum value. At step 64, the integer-valued bits of the sum value are output as the rounded two's complement integer value.

While FIG. 3 shows step 60 occurring after steps 52, 54, 56, the shifting could also take place before steps 52, 54, 56 such that the significand of the floating-point value is shifted, and then the intermediate value is generated based on the shifted significand using steps 52, 54, 56.

The following analysis indicates why converting the floating-point value significand to a two's complement value (by inverting and adding 1), and then rounding by adding a rounding value and truncating the fractional-valued bits, would give the wrong RNA rounding result in most cases when the floating-point value is negative, and why the correct RNA rounding result can be generated by instead converting the significand to a one's complement value (by inverting without adding 1), and then rounding the one's complement value.

A floating-point number N is represented by a sign bit, an exponent exp and a significand f. The floating-point value has a value of $N=(-1)^{sign} \times 2^{exp} \times (1+\Sigma f[i] \times 2^{-1})$, where i=1 ... 23 and $f[i]=\{0,1\}$ is the $i^{th}$ most significant fractional bit of N. For this example, we shall assume that the floating-point value is represented using single precision with 23 bits for the significand, and that exp is the unbiased or "true" exponent.

Assume 0≤exp≤30, otherwise N<0 (integer underflow) or $N>+2^{31}$ or $N<-2^{31}$ (integer overflow)). Consequently, N must be a normalized number, so that $N=(-1)^{sign} \times 2^{exp} \times (\Sigma f[i] \times 2^{-i})$, where i=0 ... 23, and f[0]=1.

Also, if 23≤exp≤30, the converted result is exact.

Assume N is positive and is to be converted to a 2's-complement integer.

Then $N=2^{exp} \times (\Sigma f[i] \times 2^{-i}) = \Sigma f[i] \times 2^{exp-i}$, where i=0 ... 23 and f[0]=1. Here, every bit of N is positively-weighted. This is not the same as a 2's-complement number, where the most significant bit (msb) is negatively-weighted. Thus, for a correct conversion to a signed 2's-complement number, the msb of the integer result (weighted $+2^{+31}$) must be a '0'.

RNA rounding is defined for positive N as follows:
if N−int(N)≥0.5, then rna(N)=int(N)+1,
else rna(N)=int(N),
where int(N) means the integer part of N i.e. $\Sigma f[i] \times 2^{exp-i}$ for exp−i≥0.
e.g. N=+2.00: N−int(N)=2.00−2=+0.00; ∴rna(N)=2
e.g. N=+2.25: N−int(N)=2.25−2=+0.25; ∴rna(N)=2
e.g. N=+2.50: N−int(N)=2.50−2=+0.50; ∴rna(N)=3
e.g. N=+2.75: N−int(N)=2.75−2=+0.75; ∴rna(N)=3

Thus, by inspection, adding 0.5 to N and keeping the integer part yields rna(N) for positive N. Since the operand bits and result bits are positively-weighted (except for the result msb, which must be a '0' for positive numbers), the non-fractional bits of N+0.5 give the rounded result directly.

Now, assume N is negative and is to be converted to a 2's complement integer. Then $N=-1 \times 2^{exp} \times (\Sigma f[i] \times 2^{-i}) = \Sigma f[i] \times -2^{exp-i}$, where i=0 ... 23. That is, every bit of N is negatively-weighted. Again, note that this not the same as a 2's-complement number, where only the msb (i=0), which must be a '1' for negative N, is negatively-weighted and the other bits are positively-weighted.

RNA is defined for negative N as follows:
if int(N)−N≥0.5, rna(N)=int(N)−1,
else rna(N)=int(N).
e.g. N=−2.00: int(N)−N=−2−−2.00=+0.00; ∴rna(N)=−2
e.g. N=−2.25: int(N)−N=−2−−2.25=+0.25; ∴rna(N)=−2
e.g. N=−2.50: int(N)−N=−2−−2.50=+0.50; ∴rna(N)=−3
e.g. N=−2.75: int(N)−N=−2−−2.75=+0.75; ∴rna(N)=−3

Thus, by inspection, subtracting 0.5 from N (i.e. adding −0.5 to N) and keeping the integer part yields rna(N) for negative N. However, this does not include the conversion to 2's-complement format and these examples are in sign-magnitude format.

Let's look at some bit-strings and convert from sign-magnitude form to 2's complement form by inverting the bits and adding 1 to the least significant bit:
N=−2.00=−0010.0000 (sign-magnitude)=1110.0000 (2's-complement)
N=−2.25=−0010.0100 (sign-magnitude)=1101.1100 (2's-complement)
N=−2.50=−0010.1000 (sign-magnitude)=1101.1000 (2's-complement)
N=−2.75=−0010.1100 (sign-magnitude)=1101.0100 (2's-complement)

Adding −0.5 to these bit-strings in sign-magnitude form yields:
N=−2.00−0.5=−0010.0000+−0000.1000=−0010.1000; integer part=−2, correct rna(N)
N=−2.25−0.5=−0010.0100+−0000.1000=−0010.1100; integer part=−2, correct rna(N)
N=−2.50−0.5=−0010.1000+−0000.1000=−0011.0000; integer part=−3, correct rna(N)
N=−2.75−0.5=−0010.1100+−0000.1000=−0011.0100; integer part=−3, correct rna(N)

Adding −0.5 to these bit-strings in 2's-complement form yields:
N=−2.00−0.5=1110.0000+1111.1000=1101.1000; integer part=−3, incorrect rna(N)
(but 1101.1000×−1=0010.1000; integer part=+2)
N=−2.25−0.5=1101.1100+1111.1000=1101.0100; integer part=−3, incorrect rna(N)
(but 1101.0100×−1=0010.1100; integer part=+2)
N=−2.50−0.5=1101.1000+1111.1000=1101.0000; integer part=−3, correct rna(N)
(but 1101.0000×−1=0011.0000; integer part=+3)
N=−2.75−0.5=1101.0100+1111.1000=1100.1100; integer part=−4, incorrect rna(N)
(but 1100.1100×−1=0011.0100; integer part=+3)

What's going on?!?! How come subtracting 0.5 and keeping the integer part works in sign-magnitude but not in 2's-complement, and what should be done in 2's-complement instead?

The key lies in "keeping the integer part" i.e. truncating the number. Truncating the fractional part of a sign-magnitude number is equivalent to rounding towards zero because the truncated bits have the same sign as the number being truncated; however, truncating the fractional part of a 2's-complement number is equivalent to rounding towards −∞ because the truncated bits are all positively-weighted. Thus, for positive numbers only, truncation gives the same values for sign-magnitude and 2's-complement. This is not so for negative numbers because the fractional bits of a 2's-complement number are positive, whereas the fractional bits of a negative sign-magnitude number are negative.

Techniques that would work for negative numbers include:
1. Add +0.5 if g is low while in sign-magnitude format & then convert to 2's-complement format and truncate (g is the guard bit corresponding to the most significant fractional bit of N. If g=0 then the fractional part of N is 0≤frac(N)<0.5, while if g=1 then the fractional part is 0.5≤frac(N)<1).
2. Convert to 2's-complement format & then add +0.5 if g and s are high and truncate (s is the sticky bit corresponding to the second most significant fractional bit of N (the bit position corresponding to a value of ¼). If s=0 then the fractional part of N, frac(N), is exactly 0 or exactly 0.5, while if s=1 then frac(N) lies between 0 and 0.5 or between 0.5 and 1. Hence, if g and s are both high, 0.5<frac(N)<1).
3. Invert, add +0.5 and truncate (the present technique).

The first of these techniques works because if g (in sign-magnitude format) is low, then i−0.5<$N_{SM}$≤i, where $N_{SM}$ is a sign-magnitude number and i is some negative integer. Under RNA rounding, this number should round to i. Adding 0.5 gives i<$N_{SM}$+0.5≤i+0.5, so that performing the 2's-complement of this adjusted number and truncating (i.e. rounding towards $-\infty$) leaves i. However, if g is high, then $i-1<N_{SM}\leq i-0.5$. Under RNA rounding, this number should round to $i-1$. Adding 0 and performing the 2's-complement of this number and truncating (i.e. rounding towards $-\infty$) leaves $i-1$, as required.

The second of these techniques works because if g and s are high, then $i+0.5<N_{2c}<i+1$, where $N_{2c}$ is a 2's-complement number and i is some negative integer. Under RNA rounding, this number should round to $i+1$. Adding 0.5 gives $i+1.0<N_{2c}+0.5<i+1.5$ and truncating (i.e. rounding towards $-\infty$) leaves $i+1$, as required. However, if g or s is low (in 2's complement) then $i\leq N_{2c}\leq i+0.5$. Under RNA rounding, this number should round to i. Adding 0 and truncating (i.e. rounding towards $-\infty$) leaves i, as required.

Finally, the third technique (the present technique) works because inverting the bits of the negative sign-magnitude number $i-1<N_{SM}\leq i$, where i is some negative integer, gives a 2's-complement number $N_{inv}$ satisfying $i-1\leq N_{inv}<i$ (note that the '<' and '≤' swapped). If the guard bit, g, of N was high, we have $i-1\leq N_{SM}\leq i-0.5$, which under RNA rounding should round to $i-1$. The guard bit of $N_{inv}$ in this case must be low, giving $i-1\leq N_{inv}<i-0.5$. Adding 0.5 gives $i-0.5$: $N_{inv}<0.5<i$ and truncating (i.e. rounding towards $-\infty$) leaves $i-1$, as required. Similarly, if the guard bit, g, of N was low, we have $i-0.5<N_{SM}<i$, which under RNA rounding should round to i. The guard bit of $N_{inv}$ in this case must be high giving $i-0.5\leq N_{inv}<i$. Adding 0.5 gives $i\leq N_{inv}+0.5<i+0.5$ and truncating (i.e. rounding towards $-\infty$) leaves i, as required.

Unlike the first two techniques, the present technique only requires ONE carry-propagate addition and does not require different operations to be performed for different values of the guard and sticky bits g, s.

Therefore, the present technique of inverting the significand, adding a rounding value of a half and truncating the sum produced to ignore the fractional valued bits, leaving only the integer valued bits, enables a correct rounded two's complement integer value to be generated efficiently. Many of the steps are performed in exactly the same way regardless of whether the value is positive or negative and regardless of whether the fraction lies between 0 and a half or lies between a half and 1. The same rounding value can be used for all possible values of the floating-point value. The only difference between positive and negative numbers is that for negative floating-point numbers the significand is inverted.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A data processing apparatus comprising:
processing circuitry configured to perform a convert-to-integer operation for converting a floating-point value to a rounded two's complement integer value, said floating-point value having a significand and an exponent;
wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero;
said processing circuitry comprises intermediate value generating circuitry configured to generate an intermediate value based on said floating-point value, and adding circuitry configured to add a rounding value to the intermediate value to generate a sum value;
said processing circuitry is configured to output the integer-valued bits of the sum value as the rounded two's complement integer value; and
if said floating-point value has a negative value, then said intermediate value generating circuitry is configured to generate said intermediate value by inverting the bits of the significand of said floating-point value without adding a bit value of 1 to a least significant bit of the inverted value, wherein the rounding value has the same value irrespective of whether the floating-point value has a positive value or a negative value.

2. The data processing apparatus according to claim 1, wherein if said floating-point value has a negative value, then said intermediate value comprises the one's complement of the significand of said floating-point value.

3. The data processing apparatus according to claim 1, wherein if said floating-point value has a positive value or a zero value, then said intermediate value generating circuitry is configured to generate said intermediate value with bit values equal to the bit values of the significand of said floating-point value.

4. The data processing apparatus according to claim 1, wherein the rounding value has the same value irrespective of whether the floating-point value has a positive value, a negative value or a zero value.

5. The data processing apparatus according to claim 1, wherein the rounding value has a value equivalent to 0.5 in decimal representation.

6. The data processing apparatus according to claim 1, comprising control circuitry configured to control said processing circuitry to perform said convert-to-integer operation in response to execution of a convert-to-integer instruction.

7. The data processing apparatus according to claim 1, wherein said processing circuitry comprises shifting circuitry configured to shift said floating-point value or said intermediate value to place a least significant integer-valued bit of said floating-point value or said intermediate value at a predetermined bit position.

8. The data processing apparatus according to claim 7, wherein said shifting circuitry is configured to shift said floating-point value or said intermediate value by a shift amount dependent on said exponent of said floating-point value.

9. The data processing apparatus according to claim 7, wherein said predetermined bit position is the least significant bit position and said rounded two's complement integer value is represented as an integral data value.

10. The data processing apparatus according to claim 7, wherein said predetermined bit position is a bit position more significant than the least significant bit position, and said rounded two's complement integer value is represented as a fixed-point data value.

11. A data processing apparatus comprising:
processing means for performing a convert-to-integer operation for converting a floating-point value to a rounded two's complement integer value, said floating-point value having a significand and an exponent;
wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero;

said processing means comprises intermediate value generating means for generating an intermediate value based on said floating-point value, and adding means for adding a rounding value to the intermediate value to generate a sum value;

said processing means is configured to output the integer-valued bits of the sum value as the rounded two's complement integer value; and if said floating-point value has a negative value, then said intermediate value generating means is configured to generate said intermediate value by inverting the bits of the significand of the floating-point value without adding a bit value of 1 to a least significant bit of the inverted value, wherein the rounding value has the same value irrespective of whether the floating-point value has positive value or a negative value.

12. A method of performing a convert-to-integer operation for converting a floating-point value to a rounded two's complement integer value in processing circuitry comprising intermediate value generating circuitry and adding circuitry, said floating-point value having a significand and an exponent, wherein said convert-to-integer operation uses round-to-nearest, ties away from zero, rounding in which a fractional floating-point value lying between two adjacent integer values is rounded to the nearest adjacent integer value, with a fractional floating-point value lying halfway between two adjacent integer values being rounded to the one of the two adjacent integer values lying furthest away from zero; the method comprising steps of:

generating, by said intermediate value generating circuitry, an intermediate value based on said floating-point value;

adding, by said adding circuitry, a rounding value to the intermediate value to generate a sum value; and outputting the integer-valued bits of the sum value as the rounded two's complement integer value;

wherein if said floating-point value has a negative value, then said intermediate value is generated by inverting the bits of the significand of the floating-point value without adding a bit value of 1 to a least significant bit of the inverted value, wherein the rounding value has the same value irrespective of whether the floating-point value has positive value or a negative value.

13. The method according to claim 12, wherein if said floating-point value has a negative value, then said intermediate value comprises the one's complement of the significand of said floating-point value.

14. The method according to claim 12, wherein if said floating-point value has a positive value or a zero value, then said intermediate value generating circuitry is configured to generate said intermediate value with bit values equal to the bit values of the significand of said floating-point value.

15. The method according to claim 12, wherein the rounding value has the same value irrespective of whether the floating-point value has a positive value, a negative value or a zero value.

16. The method according to claim 12, wherein the rounding value has a value equivalent to 0.5 in decimal representation.

17. The method according to claim 12, wherein said method is performed by processing circuitry in response to execution of a convert-to-integer instruction.

18. The method according to claim 12, comprising a step of shifting said floating-point value or said intermediate value to place a least significant integer-valued bit of said floating-point value or said intermediate value at a predetermined bit position.

19. The method according to claim 18, wherein said floating-point value or said intermediate value is shifted by a shift amount dependent on said exponent of said floating-point value.

* * * * *